United States Patent [19]
Co et al.

[11] Patent Number: 5,173,755
[45] Date of Patent: Dec. 22, 1992

[54] CAPACITIVELY INDUCED ELECTROSTATIC DISCHARGE PROTECTION CIRCUIT

[75] Inventors: Ramon Co, Trabuco Canyon; Kwok Fai V. Lee, Irvine; Kenneth W. Ouyang, Huntington Beach, all of Calif.

[73] Assignee: Western Digital Corporation, Irvine, Calif.

[21] Appl. No.: 711,101

[22] Filed: Jun. 3, 1991

Related U.S. Application Data

[63] Continuation of Ser. No. 351,718, May 12, 1989, abandoned.

[51] Int. Cl.$^5$ ............... H01L 29/06; H01L 29/90; H01L 27/02
[52] U.S. Cl. .................. 257/361; 257/360; 257/296
[58] Field of Search .......... 357/23.13, 13, 51

[56] References Cited

U.S. PATENT DOCUMENTS

| | | | |
|---|---|---|---|
| 4,408,245 | 10/1983 | Pryor | 357/23.13 |
| 4,423,431 | 12/1983 | Sasaki | 357/23.13 |
| 4,605,980 | 8/1986 | Hartranft et al. | 357/23.13 |
| 4,760,434 | 7/1988 | Tsuzuki et al. | 357/23.13 |
| 4,777,518 | 10/1988 | Mihara et al. | 357/23.13 |

OTHER PUBLICATIONS

E. Fujishin et al., "Optimized ESD Protection Circuits for High-Speed MOS/VLSI", Proc. Custom Integrated Circuits Conference, May 1984, p. 569.
A. Ochoa, Jr., et al., "Snap-Back: A Stable Regenerative Breakdown Mode of MOS Devices", IEEE Trans. on Nuclear Science, vol. NS-30, No. 6, Dec. 1983, p. 4127.
L. R. Avery, "Using SCR's as Transient Protection Structures in Integrated Circuits", RCA DSRC, Princeton, New Jersey.
N. H. E. Weste et al., "Principles of CMOS VLSI Design", pp. 224-231, Addison-Wesley Publishing Company.
I. C. Chen et al., "The Effective Channel Hot Carrier Stressing on Gate Oxide Integrity in MOS FET", Proc. Int'l. Reliability Physics Symposium, 1988.
N. Khurana et al., "ESD on CHMOS Devices-Equivalent Circuits, Physical Models and Failure Mechanism", Proc. Int'l. Reliability Physics Symposium, 1985.
C. Duvvury et al., "ESD Protection Reliability in One Micron Technologies", Proc. Int'l. Reliability Physics Symposium, 1986.

Primary Examiner—Andrew J. James
Assistant Examiner—Ngan V. Ngo
Attorney, Agent, or Firm—Spensley Horn Jubas & Lubitz

[57] ABSTRACT

An integrated circuit electrostatic discharge (ESD) protection circuit employs a capacitor and a zener diode to trigger a thick oxide ESD shunt field effect transistor (FET). When an ESD induced voltage at an input or output node reaches the turn-on voltage determined by the zener diode breakdown voltage, the shunting transistor is turned on by current capacitively coupled to the base of the parasitic bipolar transistor inherently formed in the thick oxide FET. The parasitic bipolar transistor is turned on in its saturated mode, substantially shorting the node to ground. At the end of the ESD event when the ESD induced current is no longer sufficient to keep the shunting transistor in its saturated mode, the shunting transistor turns off and the ESD protection circuit returns to its off mode, monitoring the input or output node for the occurrence of another ESD event.

16 Claims, 2 Drawing Sheets

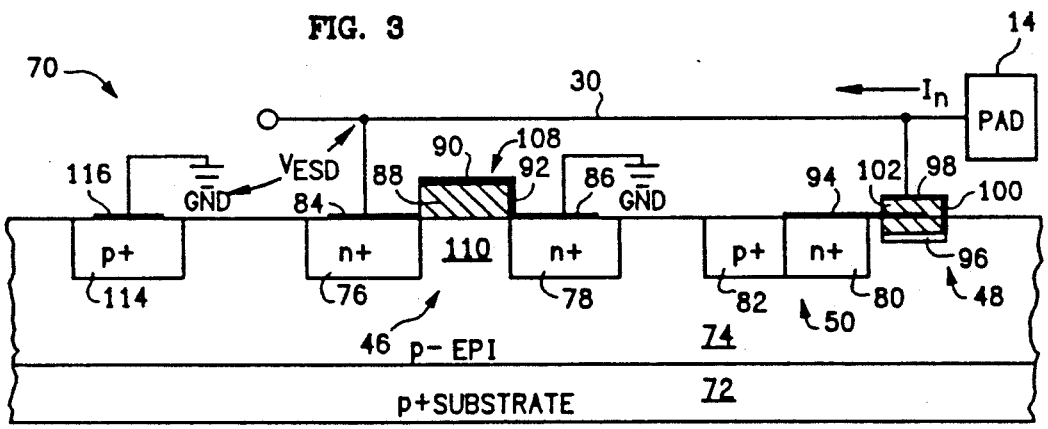
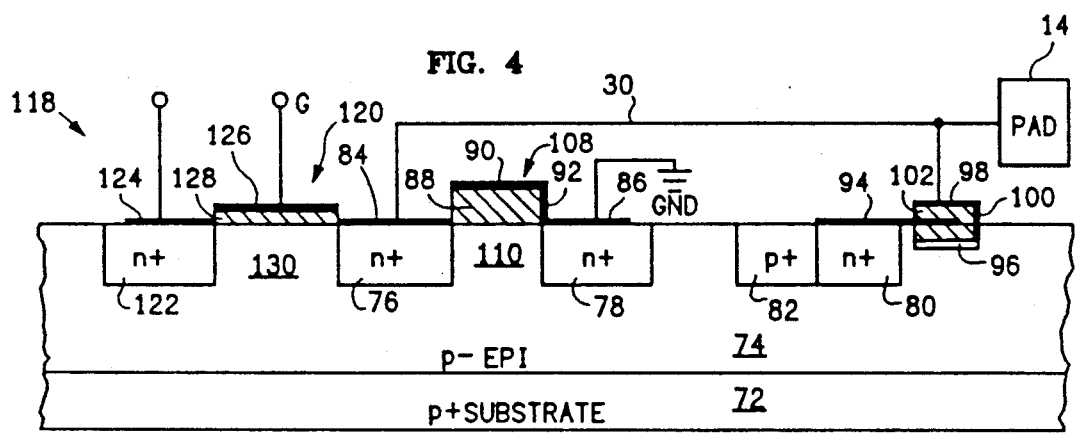
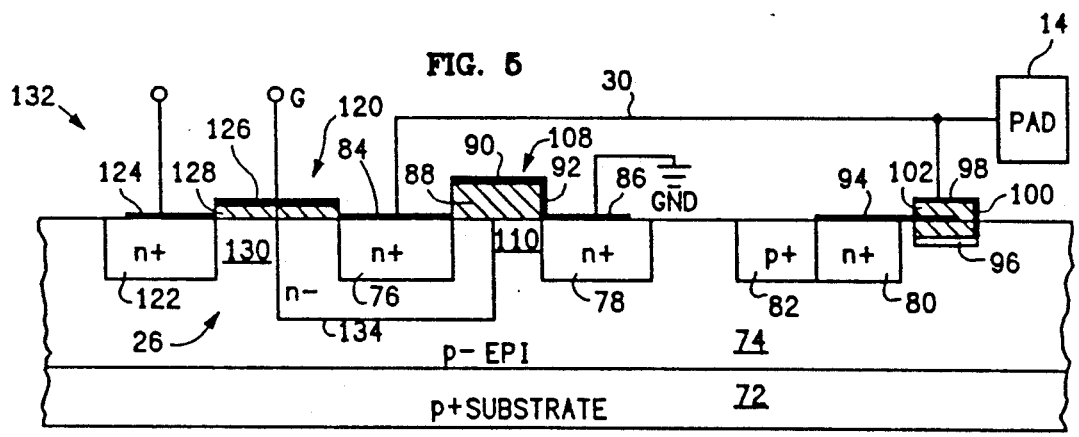

CAPACITIVELY INDUCED ELECTROSTATIC DISCHARGE PROTECTION CIRCUIT

This is a continuation of application Ser. No. 351,718, filed on May 12, 1989, now abandoned.

BACKGROUND OF THE INVENTION

1. Field of the Invention

The present invention relates to electronic integrated circuits. More particularly, the present invention relates to circuits for protecting integrated circuits against damage caused by electrostatic discharge ("ESD").

2. Description of the Prior Art and Related Information

Integrated circuits are susceptible to physical damage and destruction from extremely high voltages and currents induced within them by electrostatic discharge pulses. Such ESD pulses typically originate from handling of the circuit during manufacture, assembly and installation. The susceptibility of integrated circuits to ESD damage becomes even more acute as the density of the integrated circuits becomes greater and the geometry of the devices formed therein becomes smaller. As the device geometries are reduced and the devices are packed more closely together, device breakdown voltages are lowered and currents capable of overheating components are more frequently reached by the voltages and currents induced by an electrostatic discharge event.

Various types of circuits have been used to protect the input and output components of an integrated circuit. In a first type of circuit, a resistor is placed in series in the signal path between the input or output pad and the input or output buffer circuitry, respectively. The resistor serves to reduce current levels, and resulting damage to the IC, during ESD events. Shunting diodes are also sometimes employed in this type of circuit to shunt ESD pulses away from the buffer circuitry. For example, two shunting diodes are commonly employed, one diode having its cathode connected to the positive power supply connection and the second diode having its anode connected to the circuit ground connection. Thus, during an ESD event the voltage level at the diode/pad connection will be limited to a range between one diode voltage drop greater than the power supply voltage and one diode voltage drop below ground. The series resistor also reduces the current coming into this connection so as to prevent damage to the shunting diodes.

In a second type of circuit, shunting metal-oxide semiconductor field-effect transistors ("MOSFETs") having thick gate oxides are coupled between the input or output circuit path to be protected and circuit ground. The MOSFETs' drains and gates are connected to the circuit path to be protected and their sources are connected to circuit ground. The gate oxide thicknesses are chosen to provide threshold voltages for the MOSFETs such that they turn on at predetermined ESD protection voltages, typically approximately ±30 volts. MOSFETs of opposite conductivity types are used so as to provide protection against ESD pulses of both polarities. During an ESD event, the MOSFETs turn on rapidly when the ESD induced voltage rises above or below the respective threshold voltages. The turned on MOSFET's conductive channel shunts the ESD induced current to circuit ground and clamps the ESD induced voltage to a safe low level. Once the ESD induced voltage drops below the threshold voltage the MOSFET returns to its off state.

The two above-described types of prior art protection circuits, although somewhat effective, suffer from several drawbacks. In the first type of circuit, the series resistor provides an added load in the input or output circuit. This load may be a significant drawback in high speed integrated circuits or integrated circuits driving high current outputs For example, the load introduced by the resistor acts in conjunction with the input or output capacitance of the other input or output circuitry to produce an "R-C" time constant This R-C time constant becomes critical in many high speed circuits due to the inherent delay, and in analog devices due to signal distortion caused by non-linear group delay. However, if this series resistance were eliminated, the shunting diodes and/or the input/output devices would be destroyed by excessive ESD induced current and the circuit would be unprotected or destroyed.

In the second type of circuit, the typical threshold voltages for thick oxide MOSFETs are higher than the voltages at which modern high speed CMOS devices break down. Thus, by the time the thick oxide MOSFETs turn on, the devices sought to be protected are already destroyed. Lowering the threshold voltage by reducing the thickness of the gate oxide provides no solution, since thinner gate oxides degrade rapidly with ESD currents, causing the device to fail prematurely, thereby destroying the ESD protection device.

Additionally, many specific applications of integrated circuit chips place them in an environment where high voltage DC power sources are present. In such applications, resistance to a sustained DC current resulting from accidental coupling to such a power supply is necessary. The aforementioned ESD protection circuits do not provide protection against such sustained DC currents, however, since both the series resistor and diode shunt circuits would overheat and be destroyed from a sustained high current flow.

Accordingly, there is a need for an on-chip ESD protection circuit which does not introduce signal delay and/or distortion. Moreover, there is a further need for such a circuit which provides ESD protection at the low voltages required by modern VLSI circuits. Additionally, there is a need for an ESD protection circuit which is resistant to damage from coupling to high voltage DC power supplies.

SUMMARY OF THE INVENTION

The present invention provides an integrated circuit on-chip ESD protection circuit which shunts ESD induced current and clamps ESD induced voltage during an ESD event to protect the integrated circuit.

The present invention further provides an ESD protection circuit which does not employ a large series resistance, thereby avoiding signal distortion and delay.

The present invention further provides an ESD protection circuit which is resistant to damage from accidental coupling to DC power supplies.

The present invention further provides an ESD protection circuit which provides ESD and DC voltage protection at the voltages where protection is required by modern VLSI device geometries.

In a preferred embodiment, the ESD protection circuit of the present invention provides a shunt circuit, coupled to an integrated circuit input/output circuit path, to shunt ESD pulses to ground. A shunt thick oxide field-effect transistor ("FET") is connected from the circuit path to be protected to circuit ground. Inherent to the structure of this FET is a parasitic bipolar junction transistor ("BJT"), wherein the drain of the FET corresponds to the collector of the BJT, the channel corresponds to the base, and the source corresponds to the emitter. Also, in a parallel connection from the circuit path to be protected to circuit ground, and preferably formed on the same integrated circuit substrate, is a series combination of a capacitor, zener diode and resistor. This parallel circuit is electrically coupled to the base of the parasitic BJT device inherently formed in the thick oxide shunt transistor. This parallel circuit serves to turn on the shunt transistor at a selectable voltage which is lower than an avalanche breakdown turn-on voltage of the shunt transistor. The capacitor prevents sustained DC current flow and thus prevents the parallel circuit from being destroyed by a sustained DC current from accidental coupling to a DC power supply. The zener diode has a selectable, relatively low breakdown voltage and thus provides selectability of the voltage at which the shunt transistor is to turn on. The resistor, preferably formed by the inherent substrate resistance between the zener diode and BJT, is the element across which a bias voltage to turn on the parasitic BJT is developed.

In operation, since the ESD pulse is very transient, the capacitor effectively acts as a short between the zener diode and circuit path to be protected. Therefore, when an ESD induced voltage on the circuit path to be protected rises to the level of the zener diode's breakdown voltage, current flows and develops a voltage across the resistor. This forward biases the base/emitter junction of the parasitic BJT, turning on the BJT and therefore turning on the shunt FET. This causes the ESD induced current on the circuit path to be protected to be shunted to circuit ground and the ESD induced voltage to be clamped to a safe, selectable low level. Thus, the ESD protection circuit of the present invention takes advantage of the inherent parasitic BJT within the shunt FET's structure, using it to turn on the FET at a lower safer voltage than the avalanche breakdown voltage of the FET. Additionally, by tailoring the capacitance of the capacitor relative to the intrinsic capacitance of the zener diode, the shunt transistor can be prevented from turning on in response to a DC voltage applied to the circuit path to be protected. Thus, damage to the shunt transistor as well as the zener diode from sustained DC current flow may be prevented. At the end of the ESD event, when the ESD induced current decreases towards zero, the BJT returns to its normally open state, thereby effectively removing the shunt electrically from the circuit.

The ESD protection circuit thus remains ready for the next ESD event while contributing no effect to normal circuit operation.

Thus, the ESD protection circuit of the present invention shunts ESD induced currents and clamps ESD induced voltages during an ESD event without introducing signal delay or distortion. Furthermore, the ESD protection circuit of the present invention provides such protection at selectable low voltages. Additionally, the ESD protection circuit of the present invention is resistant to damage from coupling to DC power supplies.

BRIEF DESCRIPTION OF THE DRAWINGS

FIG. 3 is a cross-sectional view of a portion of a CMOS integrated circuit employing the ESD protection circuit of the present invention;

FIG. 4 is a cross-sectional view of a CMOS integrated circuit employing the ESD protection circuit of the present invention incorporated with an input/output buffer transistor; and FIG. 5 is a cross-sectional view of a CMOS integrated circuit employing a high breakdown voltage transfer gate incorporated in the same substrate with the ESD protection circuit of FIG. 3.

DETAILED DESCRIPTION OF THE PREFERRED EMBODIMENT

Figure 1:
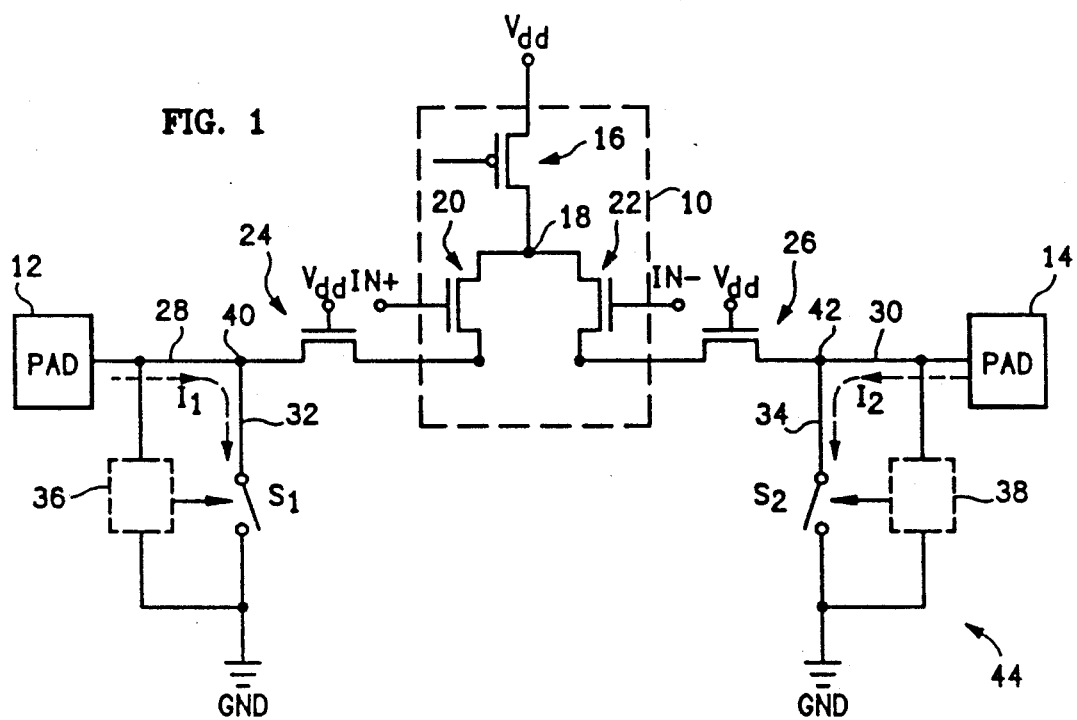
FIG. 1 is an electrical schematic diagram of an ESD protection circuit of the present invention forming part of a CMOS integrated circuit output circuit.

Referring to FIG. 1, an electrical schematic drawing illustrates the ESD protection circuit of the present invention implemented as part of a CMOS integrated circuit output circuit. As illustrated in FIG. 1, the output circuit has an output buffer circuit 10 receiving data signals IN+ and IN− and providing output signals to integrated circuit output pads 12, 14. These output pads 12, 14 will typically be the source of potentially destructive high voltage ESD pulses.

In the specific embodiment illustrated in FIG. 1, output buffer circuit 10 is an output current driver circuit which provides an output current to output pads 12, 14, respectively, in response to data signals IN+ and IN−. The output driver circuit 10 thus serves to steer current to one of output pads 12 or 14 based on the respective input signals, IN+ or IN−, which will typically be provided from other circuitry on the integrated circuit chip (not shown) and in a CMOS application would typically be complementary signals. The specific output driver circuit 10 illustrated in FIG. 1 is suitable for providing a relatively high output current signal to pads 12 and 14, for example, to drive an output cable coupled to the integrated circuit chip. The specific current driver circuit 10 illustrated in FIG. 1 employs a current source in the form of a p channel field-effect transistor (FET) 16 with its gate coupled to a bias potential (not shown) and the source thereof coupled to a reference potential $V_{dd}$. The current from p channel FET 16 is then split in parallel paths at node 18 and provided to n channel FETs 20, 22 which receive data signals IN+ and IN− at their respective gates. The signals IN+ and IN− thus steer the output driver current to respective output pads 12 and 14.

It will be appreciated that the specific output driver circuit 10 illustrated in FIG. 1 is very much application specific and a wide variety of other output buffer circuits 10 may be employed for different applications For example, one common output buffer circuit is a CMOS inverter gate receiving input data signals, corresponding to signals IN+ and IN− illustrated in FIG. 1, at the gates of the p channel and n channel FETs forming the CMOS inverter gate. In such an output circuit the inverter output is typically provided to a single output pad. Additionally, various other output buffer circuits may be employed such as a single pull-up or a single pull-down FET driving a single or plural output pads, or multiple pull-up or pull-down FETs driving one or more output pads. Also, the ESD protection circuit of the present invention may equally be employed to protect integrated circuit input circuits. Accordingly, if the pad 12 or pad 14 illustrated in FIG. 1 is considered an input pad, then buffer circuit 10 may take the form of any one of a variety of input buffer circuits. Accordingly, it should be appreciated that the specific output circuit illustrated in FIG. 1 with a high current output driver 10 driving output pads 12 and 14 is purely for illustrative purposes.

Referring to FIG. 1, two transfer gates, 24, 26 are provided in series between output buffer circuit 10 and respective output pads 12 and 14. As shown in FIG. 1, transfer gates 24, 26 may employ n channel field-effect transistor with the gate thereof coupled to $V_{dd}$ so as to be in a normally on condition. Thus, the transfer gates 24, 26 will provide a straight current path during normal circuit operation. However, if a large DC voltage is applied to pad 12 or pad 14 of polarity such as to reverse bias the FETs forming transfer gates 24, 26, the respective transfer gate will turn off. Thus, a suitably designed FET structure for transfer gates 24 and 26 may provide substantial protection against a large DC voltage inadvertently applied to pads 12 or 14. Such a suitable field-effect transistor structure and the operation thereof in a transfer gate is described in more detail in copending application Ser. No. 351,669 commonly with the present application and filed concurrently herewith, for a "High DC Breakdown Voltage Field Effect Transistor and Integrated Circuit" to Kenneth Ouyang, Jui C. Liang and Ramon Co, the disclosure of which is incorporated herein by reference.

Still referring to FIG. 1, the pads 12 and 14 are coupled to the respective transfer gates 24, 26 along circuit paths 28, 30, respectively. These circuit paths 28, 30 thus provide the primary circuit paths requiring protection from ESD pulses originating from output pads 12, 14.

When an electrostatic event takes place at either of the pads 12, 14, an electrostatic discharge ("ESD") occurs introducing electrostatic energy to the respective pad. For example, a pulse on pad 12 induces an ESD current $I_1$ which flows inward from the pad 12 toward the input node 40. Similarly, when an ESD event takes place at output pad 14, electrostatic energy induces an ESD current $I_2$ flowing from the output pad 14 toward the output node 42. Due to the nature of an ESD event, the voltages applied to the pads and the induced currents $I_1$, $I_2$ are typically quite large in magnitude. Damage due to internal arcing and/or internal overheating of active components due to excessive ESD current flow will thus typically result.

Parallel shunt paths 32, 34 are provided to shunt potentially dangerous ESD currents, $I_1$, $I_2$ to ground in the case of an ESD event. As illustrated schematically in FIG. 1, respective shunting circuits 36, 38 selectively open and close shunt switches $S_1$ and $S_2$. The switches $S_1$ and $S_2$ when closed thus serve to divert current at nodes 40, 42, respectively, away from the primary circuit paths 28, 30 in the case of an ESD event on the pad 12 or 14.

At the beginning of an ESD event when electrostatic energy is introduced to the output pad 12 or 14 the respective shunting circuit 36, 38 senses the ESD induced increase in voltage at output nodes 40, 42 with respect to circuit ground. When this voltage exceeds a predetermined value, the switch $S_1$ or $S_2$ closes, becoming a low impedance shunt. This provides a low impedance path for the ESD induced current $I_1$, $I_2$ and a clamping mechanism to prevent the ESD induced voltage from increasing to a destructive level. At the end of the ESD event when the ESD induced current $I_1$, $I_2$ has decreased below a predetermined value, the circuitry 36, 38 returns switch $S_1$, $S_2$ to its normally open state.

Figure 2:
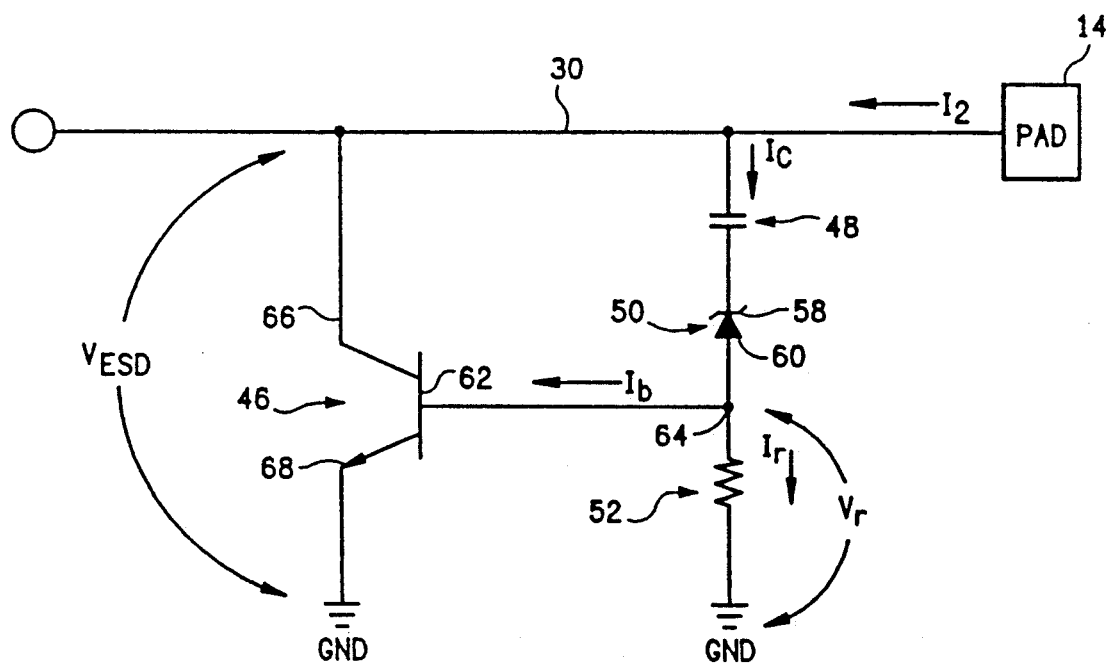
FIG. 2 is an electrical schematic diagram of the equivalent circuit model for the ESD protection circuit of the present invention.

FIG. 2 illustrates schematically the equivalent circuit model for a preferred embodiment of the ESD protection circuitry 44 illustrated in FIG. 1 schematically as shunt circuit 38, shunt path 34 and switch $S_2$ coupled to pad 14. ESD protection circuit 44 includes an NPN bipolar junction transistor ("BJT") 46 which functions as a shunt path from pad 14 to ground when in a conductive state. Circuit 44 also includes a parallel circuit to ground including a capacitor 48, a zener diode 50 and a resistor 52 in series between circuit path 30 and ground. As discussed below, the capacitor 48 effectively shorts the signal path 30 and the cathode 58 of the diode 50 for ESD pulses but acts as a current block for DC voltages. The resistor 52 in turn electrically connects the anode 60 of the diode 50 to circuit ground. As shown in FIG. 2, base 62 of the transistor 46 is coupled to the parallel shunt path at the node 64 formed by the connection of the anode 60 of the diode 50 and the resistor 52 The collector 66 of the transistor 46 connects to the signal path 30, and the emitter 68 of the transistor 46 connects to circuit ground.

Prior to an ESD event, the shunt transistor 46 is in a nonconductive state, the diode 50 is in a reverse-biased nonconductive state, and the capacitor 48 contains substantially no electrical charge. At the beginning of an ESD event, an ESD induced voltage $V_{ESD}$ appears on the signal line 30 with respect to circuit ground. Since the ESD pulse is very short and since capacitor 48 is initially uncharged, the capacitor 48 appears as a short circuit. This allows a current $I_c$ to flow through the capacitor 48 due to the voltage potential $V_{ESD}$ on the signal line 30 with respect to circuit ground. Furthermore, since the capacitor 48 appears as a short circuit, the induced voltage $V_{ESD}$ appears at the cathode 58 of the diode 50 with respect to circuit ground. When this voltage $V_{ESD}$ reaches the value of the zener breakdown voltage of the diode 50, the diode 50 begins to conduct. This allows the current $I_c$ to flow through the capacitor 48, diode 50 and resistor 52 to circuit ground. Since the transistor 46 is still turned off at this point in time, substantially no base current $I_b$ flows into the base 62. Therefore, the current $I_r$ flowing through the resistor 52 is substantially equal to the current $I_c$ flowing through the capacitor 48 and diode 50.

As the induced voltage $V_{ESD}$ increases, the current $I_c$ through the capacitor 48, and therefore the current $I_r$ through the resistor 52, also increases. This results in an increased voltage $V_r$ appearing across the resistor 52. When this voltage $V_r$ becomes high enough to forward bias the junction between the base 62 and emitter 68 of the transistor 46, the transistor 46 will turn on. (For a silicon bipolar transistor, this voltage value will be approximately 0.7 volts.) Since no resistance appears between the emitter 68 of the transistor 46 and circuit ground, the equivalent input resistance at the base 62 is very low. Therefore the base current $I_b$ will be relatively high and the transistor 46 will turn on in a saturated mode. In this saturated condition, the output impedance of the transistor 46, represented by the current path through the transistor 46 from the collector 66 to the emitter 68, is very low. This low impedance acts as an effective current shunt for the ESD induced current $I_2$. Thus, most of the current $I_2$ flows through the transistor 46 to ground, protecting circuit path 30, and output circuitry 10 coupled thereto, from damage from the ESD pulse.

During the ESD event, the current $I_c$ flowing through the capacitor 48 will cause the capacitor 48 to charge. The ESD pulse only lasts a relatively short time, however, relative to the time constant of the capacitor 48. This time constant is based upon the capacitance value of the capacitor 48, the inherent capacitance of the diode 50, and the resistance value of the resistor 52. Due to the short nature of typical ESD pulses, this time constant will be much shorter for most values of these parameters and the capacitor 48 will not become fully charged during the ESD event. Once the bipolar transistor 46 is turned on it enters the snap back stage and maintains the highly conductive state until $I_2$ drops to a low value, even after capacitor 48 is charged up. Accordingly, as long as the ESD induced current $I_2$ is sufficiently high, the transistor 46 will remain conductive. Once the current $I_2$ decreases to a value insufficient to maintain transistor 46 turned on, however, the transistor 46 will turn off, returning to its nonconductive state.

In response to accidental coupling of pad 14 to a DC power supply, however, the operation of circuit 44 would be much different. In such circumstance, the DC voltage will be much lower than for an ESD event, for example +15 volts for typical DC power supplies employed in electronics systems. The voltage will be sustained indefinitely, however, rather than being an extremely short pulse as in an ESD event. In such circumstance, a shunt to ground is not desired since the DC supply would be shorted out, possibly damaging the entire system of which it forms a part. Alternatively, sustained current would be drawn through the shunt circuitry eventually destroying it. Therefore, in response to coupling pad 14 to a DC voltage it is desired that transistor 46 remain off and current flow blocked. By suitable selection of the capacitance of capacitor 48, the voltage and current to base 62 during coupling to the relatively low DC voltage may be maintained sufficiently low to prevent shunt transistor 46 from turning on. DC current will flow into capacitor 48 until it is fully charged, thus blocking current flow into circuit 44 entirely. Current flow to output buffer circuitry 10 will in turn be blocked by transfer gate 26 (shown in FIG. 1) which will be reverse biased by the DC voltage.

Accordingly, circuit 44 prevents destructive current flow from coupling pad 14 to a DC voltage while retaining the ability to shunt away ESD current from higher voltage ESD pulses.

In an application where accidental coupling of the input/output pads to a DC power supply is not likely, the capacitor 48 illustrated in FIG. 2 may be replaced with a direct coupling between pad 14 and diode 50. In this case, however, the breakdown voltage of the zener diode 50 must be greater than the operating voltage of the chip, e.g., +5 volts, to ensure that this voltage on the output pad 14 does not turn on the diode 50. This will allow the ESD current to be directly coupled into the shunt transistor 46 thereby turning it on and the shunt transistor 46 will only be shut off by termination of the ESD pulse.

The circuit model configuration depicted in FIG. 2 provides voltage-clamping and current-shunting for a positive ESD induced voltage $V_{ESD}$ with respect to circuit ground. However, it will be readily appreciated that for protecting against a negative ESD induced voltage $V_{ESD}$, a complementary circuit configuration may be used. This complementary configuration would employ a PNP shunt transistor in place of NPN transistor 46. Also, the anode 60 and cathode 58 connections of the zener diode 50 would be interchanged. The above described circuit operation would otherwise be the same, however, with the exception that the polarity of the voltage $V_{ESD}$ and the direction of the flow of the current $I_2$ would be reversed.

Referring to FIG. 3, a cross-sectional view of a CMOS integrated circuit 70 incorporating the above-described embodiment of the circuit 44 of the present invention is illustrated. As shown in FIG. 3, the transistor 46, capacitor 48 and zener 50 illustrated schematically in FIG. 2 are integrated in a substrate of p type silicon having a body portion 72 and a more lightly doped epitaxial layer 74. The relative dimensions of these regions illustrated in FIG. 3 are not to scale, for space considerations, and, for example, body portion 72 will typically be much thicker than epitaxial layer 74. The transistor 46, capacitor 48 and zener 50 are preferably formed in p− epitaxial layer 74. In other CMOS processes however, different layouts in the integrated circuit substrate may be employed.

The CMOS integrated circuit illustrated in FIG. 3 functions substantially according to the circuit model illustrated in FIG. 2 and described above. As will be appreciated from FIG. 3, however, the transistor 46 and resistor 52 discussed above are parasitic devices, rather than devices distinctly fabricated as suggested by the equivalent circuit of FIG. 2. In the embodiment of FIG. 3, the parasitic BJT 46 is inherently present in a thick oxide FET 108 fabricated on the integrated circuit substrate. Thick oxide FET 108 has a drain region 76, a source region 78, a channel region 110, and a gate 90. This FET 108 serves as the shunting device for shunting the ESD induced current $I_2$ during an ESD event as described above. The thick oxide layer 88 serves to prevent oxide breakdown and possible shorting due to the "hot" electrons generated in the channel region 110 during an ESD pulse. For example, an oxide thickness of 1-2 microns may be employed. The gate 90 of the FET 108 is electrically coupled to the source 78 by a "via" 92, thereby causing the channel 110 to normally be nonconductive. The FET 108 will thus remain nonconductive until either breakdown conduction in the channel 110 occurs or the channel 110 is made conductive by some other means. In the illustrated embodiment, the channel 110 is made conductive by taking advantage of the inherent parasitic BJT formed within the CMOS circuit 70. The channel 110 serves as the base 62 of the parasitic transistor 46 (see discussion above for FIG. 2), the first n+ diffusion region 76 serves as the collector 66 of the parasitic transistor 46 and the second n+ diffusion region 78 serves as the emitter 68 of the parasitic transistor 46. The drain contact 84 serves as a means of connecting this n+ diffusion region 76 to the signal path 30 and is preferably a metallization layer. The source contact 86 is similarly a metallization layer coupling n+ diffusion region 78 to circuit ground.

The capacitor 48 is formed by interleaving a top capacitor plate 98, a center capacitor plate 94, and a bottom capacitor plate 96, separated by a dielectric material 102. Interleaving the capacitor plates 94, 96, 98 increases the effective plate area and therefore the effective capacitance, while minimizing the area on the CMOS integrated circuit 70. The bottom capacitor plate 96 is preferably a polysilicon layer embedded in the p— epitaxial layer 74 and is electrically coupled to the top capacitor plate 98, a metal layer, by a via 100. The center capacitor plate 94 serves as the contact for the third n+ diffusion region 80. In a preferred embodiment, the value of the capacitor 48 is approximately 3.8 picofarads. This capacitance may vary considerably, with the specific integrated circuit design. The capacitance should be chosen to prevent the thick oxide FET 108 from being turned on by a DC voltage coupling to pad 14. For example, a capacitance approximately twenty times the value of the inherent parasitic capacitance of the zener diode 50 in its "off" state will be suitable for DC voltages of approximately +15 volts.

Capacitor plate 94 also serves as the cathode contact of the zener diode 50. The p+ diffusion region 82 serves as the anode 60 of the zener diode 50. Thus, the zener diode 50 is formed by the adjacent n+ and p+ diffusion regions 80, 82. The diffusion regions 80, 82 comprising the zener diode 50 are each approximately 25 microns wide and 5 microns long, and provide a breakdown voltage of approximately 5 volts for conventional n+ and p+ doping concentrations. The size and doping concentrations of these regions may be adjusted to vary the breakdown voltage of the zener diode 50, as desired for the specific application.

As shown in FIG. 3, the integrated circuit substrate is coupled to ground via p+ contact diffusion 114 formed in epitaxial layer 74 and contact 116. The p— epitaxial region between the p+ contact diffusion 114 and the p+ diffusion region 82, having a finite value of parasitic resistance, thus forms the resistor 52. This parasitic resistor region resistively couples the anode 60 of the zener diode 50, as formed by the p+ diffusion region 82, to circuit ground via the source contact 116. For a bulk resistance of p— epitaxial layer of approximately 600 ohms/□, suitable effective resistance for resistor 52 is provided to bias the base/emitter junction to turn on parasitic BJT 46.

For a positive ESD induced voltage $V_{ESD}$, the embodiment of the circuit of the present invention shown in FIG. 3 and described above performs substantially according to the circuit model illustrated in FIG. 2 and described above.

For a negative ESD induced voltage the first n+ diffusion region 76 becomes negative (via its contact 84) with respect to the p— epitaxial layer 74 which is at circuit ground potential. This causes the parasitic diode, formed by the first n+ diffusion region 76 and p— epitaxial layer 74, to become forward biased. This clamps the voltage $V_{ESD}$ to one diode voltage drop (approximately 0.7 volt for silicon) below circuit ground potential, and shunts the current $I_2$ to ground.

FIG. 4 illustrates a cross-sectional view of a CMOS integrated circuit 118 employing the above-described embodiment of the circuit of FIG. 3, wherein the thick oxide FET 108 shares its drain n+ diffusion region 76 with an active n channel FET 120. FET 120 may correspond to transfer gate 26 illustrated in FIG. 1 or may be a pull-down FET from buffer circuit 10. The first n+ diffusion region 76 serves as either the drain or source of the FET 120 and a fourth n+ diffusion region 122 then serves as either the source or drain of the MOSFET 120. This diffusion region 122 also has a contact electrode 124 as a means of interfacing with other devices on the integrated circuit. The gate of the MOSFET 120 is formed with a gate contact 126 separated from the p— epitaxial layer 74 by an oxide layer 128. Since FET 120 is an active device with its gate 126 driven by on-board voltages, oxide layer 128 will be much thinner than that of thick oxide FET 108. For example, in currently preferred CMOS processes oxide layer 12 may be 200-300 Å thick. The region 130 immediately below the oxide layer 128 forms the channel of the FET 120. By having the thick oxide FET 108 of the above-described embodiment of the circuit of the present invention share its drain diffusion region 76 with a FET 120, less area within the epitaxial layer 74 is required.

FIG. 5 illustrates a cross-sectional view of a CMOS integrated circuit 132 corresponding to FIG. 4 with the addition of an n— well region 134. In this embodiment, the drain diffusion region 76 is contained within an n— well region 134. This n— well region 134 increases the breakdown voltage of the channel 130 of the FET 120. This embodiment of FET 120 is suitably employed as a transfer gate, such as transfer gate 26 of FIG. 1, where pad 14 may be coupled to relatively large DC voltages. This is the subject of above-mentioned co-pending patent application for "High DC Breakdown Voltage Field Effect Transistor and Integrated Circuit". Since the transfer gate n well region 134 will also provide a high breakdown voltage for the thick oxide field effect transistor 108 due to shared n+ diffusion 76, avalanche breakdown turn on of the transistor 108 would normally only occur at relatively high voltages. Such high voltages could be potentially destructive to the devices on the integrated circuit chip sought to be protected by the ESD protection circuit of the present invention. The capacitively coupled turn on circuitry, however, allows the thick oxide field effect transistor 108 to be turned on at selectable relatively low voltages. Therefore, the high breakdown voltage transfer gate 26 in conjunction with the capacitively induced turn on of the shunt thick oxide field effect transistor provides effective resistance to both ESD pulses and coupling to DC power supplies.

The foregoing description is to be considered as merely exemplary and not limiting in any way with respect to the present invention and any embodiment thereof. For example, it will be readily appreciated that a complementary conductivity type embodiment may be used. This complementary embodiment would comprise interchanging the p+ diffusion regions with the n+ diffusion regions, and replacing the p— epitaxial layer with an n— epitaxial layer. This complementary embodiment would protect against negative ESD induced voltages and currents according to the circuit model of FIG. 2 (with a PNP BJT 46 and reverse-connected zener diode 50, as mentioned above), and protect against positive ESD induced voltages and currents by way of its inherent parasitic diode. Numerous other modifications to the above described preferred embodiment are also possible while remaining within the scope of the present invention.

What is claimed is:
1. An improved integrated circuit chip, comprising:
    a semiconductor substrate of a first conductivity type having an upper major surface;
    an electrical contact pad formed on said upper major surface of said substrate;
    a shunt transistor operable only in a bipolar mode, formed on said upper major surface of said substrate, said shunt transistor having a first region, a second region and a third region formed in said substrate, wherein said first and third regions are highly doped regions of a second conductivity type and said second region is a lightly doped region of said first conductivity type having a length defined by the spacing between said first and third regions, and wherein said first region is electrically coupled to said electrical contact pad; and a zener diode formed on said upper major surface of said substrate, said zener diode having a first diode region and an adjacent second diode region formed in said substrate, wherein said first diode region is a highly doped region of said first conductivity type, and said second diode region is a highly doped region of said second conductivity type, and wherein said second diode region is electrically coupled to said pad and said first diode region is electrically coupled to said second diode region at a diode junction and to said substrate such that substantially all current flowing into said first diode region from said second diode region is injected into said substrate, and wherein said first diode region is spaced apart from but adjacent to said second region of said shunt transistor.

2. An integrated circuit as set out in claim 1, wherein said shunt transistor further comprises a thick oxide layer formed over said second region and a gate electrode formed on said oxide layer to thereby form a thick oxide field effect transistor structure and wherein said gate is coupled to said third region to maintain said thick oxide field effect transistor in a normally nonconducting mode.

3. An integrated circuit as set out in claim 1, wherein said first conductivity type semiconductor material is p type doped silicon.

4. An integrated circuit as set out in claim 1, wherein said first conductivity type semiconductor material is n type doped silicon.

5. An integrated circuit as set out in claim 1, further comprising a capacitor formed in said upper major surface of said substrate, said capacitor having a first conductive layer, a second conductive layer, and a dielectric layer formed between said first and second conductive layers, wherein said first conductive layer is electrically coupled to said electrical contact pad and said second conductive layer is electrically coupled to said second diode region of said zener diode.

6. An integrated circuit as set out in claim 2, further comprising a field effect transfer gate having a source region and drain region of said second conductivity type, a channel region of said first conductivity type, and a gate oxide and gate electrode formed over said channel region, wherein said source region corresponds to said first region of said shunt transistor, and wherein said transfer gate and shunt transistor further comprise a well region of said second conductivity type formed under said source region.

7. An improved integrated circuit chip, comprising:
a silicon substrate having an epitaxial layer of a first conductivity type, said epitaxial layer having an upper major surface;
an electrical contact pad formed on said upper major surface of said epitaxial layer;
a shunt transistor formed in said epitaxial layer of said substrate, said shunt transistor having an emitter region, a base region and a collector region formed in said substrate, wherein said emitter and collector regions are highly doped regions of a second conductivity type and said base region is a lightly doped region of said first conductivity type having a length defined by the spacing between said emitter and collector regions, and wherein said collector region is electrically coupled to said electrical contact pad;

a zener diode formed on said upper major surface of said substrate, said zener diode having a first diode region and an adjacent second diode region formed in said substrate, wherein said first diode region is a highly doped region of said first conductivity type, said second diode region is a highly doped region of said second conductivity type, and said first and adjacent second diode regions form a junction, and wherein said first diode region is spaced apart from but adjacent to said base region of said shunt transistor; and a capacitor formed in said epitaxial layer of said substrate, said capacitor having a first conductive layer, a second conductive layer, and a dielectric layer formed between said first and second conductive layers, wherein said first conductive layer is electrically coupled to said electrical contact pad and said second conductive layer is electrically coupled to said second diode region of said zener diode.

8. An integrated circuit as set out as in claim 7, wherein said shunt transistor further comprises a thick oxide layer formed over said base region and a gate electrode formed on said thick oxide layer and wherein said gate is electrically coupled to said emitter region to prevent said shunt transistor from operating in a field effect transistor mode.

9. An integrated circuit as set out in claim 7, wherein said first conductivity type is p type doped silicon.

10. An integrated circuit as set out in claim 7, wherein said first conductivity type is n type doped silicon.

11. An integrated circuit, comprising:
a silicon substrate;
an electrical contact pad formed in said substrate;
transister means, formed in said substrate and eletrically coupled to said contact pad and to a ground potential for shunting current from said contact pad to ground when turned on in a conductive bipolar mode, said transistor means having a source region, a base region and a drain region, wherein said transistor means is operable only in said bipolar mode;
a capacitor, formed in said substrate and electrically coupled to said contact pad; and
means, formed in said substrate adjacent said transistor means and electrically coupled to said capacitor, for injecting current into said substrate and said base region to create a conductive path from the base region to the substrate which will turn on the bipolar mode of said transistor means when the voltage applied to the base region by said capacitor means exceeds a threshold value, thereby causing current to flow along the conductive path.

12. An integrated circuit as set out in claim 11, wherein said means for injecting current comprises a zener diode.

13. An integrated circuit as set out in claim 12, wherein said zener diode comprises a first diode region electrically coupled to said capacitor, and a second diode region coupled to said first diode region and said substrate.

14. An integrated circuit as set out in claim 13, wherein said first diode region is n+ type doped silicon and said second diode region is p+ type doped silicon.

15. An integrated circuit as set out in claim 14, wherein said first diode region and said second diode region have doping concentrations chosen to set said threshold value.

16. An integrated circuit as set out in claim 15, wherein said threshold value is approximately 5 volts.

* * * * *